(12) United States Patent
Landingham et al.

(10) Patent No.: US 9,455,366 B2
(45) Date of Patent: Sep. 27, 2016

(54) SOL-GEL PROCESS FOR THE MANUFACTURE OF HIGH POWER SWITCHES

(71) Applicant: Lawrence Livermore National Security, LLC, Livermore, CA (US)

(72) Inventors: Richard L. Landingham, Livermore, CA (US); Joe Satcher, Jr., Patterson, CA (US); Robert Reibold, Salida, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 54 days.

(21) Appl. No.: 13/843,863

(22) Filed: Mar. 15, 2013

(65) Prior Publication Data

US 2014/0264377 A1 Sep. 18, 2014

(51) Int. Cl.
*H01L 31/18* (2006.01)
*H01L 31/08* (2006.01)
*H01L 31/0312* (2006.01)

(52) U.S. Cl.
CPC ........... *H01L 31/08* (2013.01); *H01L 31/0312* (2013.01)

(58) Field of Classification Search
CPC ............... H01L 2224/48091; H01L 2924/00; H01B 3/025
USPC ............................................ 257/77; 438/502
See application file for complete search history.

(56) References Cited

U.S. PATENT DOCUMENTS

| 4,717,588 | A | * | 1/1988 | Wilson | H01L 21/221 148/DIG. 37 |
|---|---|---|---|---|---|
| 6,194,699 | B1 | | 2/2001 | Bernhoff et al. | |
| 6,252,221 | B1 | | 6/2001 | Kaneko et al. | |
| 7,850,933 | B2 | | 12/2010 | Yang et al. | |
| 7,851,336 | B2 | | 12/2010 | Poplavskyy et al. | |
| 7,893,541 | B2 | * | 2/2011 | Caporaso | H01L 31/09 257/433 |
| 7,923,368 | B2 | | 4/2011 | Terry et al. | |
| 7,959,711 | B2 | * | 6/2011 | Saukaitis et al. | 95/55 |
| 8,125,089 | B2 | | 2/2012 | Caporaso et al. | |
| 8,377,806 | B2 | * | 2/2013 | Leonard et al. | 438/510 |
| 8,884,297 | B2 | * | 11/2014 | Tezuka | C23C 16/24 257/66 |
| 9,240,506 | B2 | | 1/2016 | Werne et al. | |
| 2004/0137710 | A1 | | 7/2004 | Grigoropoulos et al. | |
| 2009/0053878 | A1 | | 2/2009 | Kelman et al. | |

(Continued)

OTHER PUBLICATIONS

Sullivan et al. (Sullivan) "6H—SiC Photoconductive Switches Triggered at Below Bandgap Wavelengths" University of California Lawrence Livermore National Laboratory Livermore, CA 94550, USA Manuscript received on Nov. 15, 2006, in final form Feb. 22, 2007.*

(Continued)

*Primary Examiner* — Jermoe Jackson, Jr.
*Assistant Examiner* — Damian A Hillman
(74) *Attorney, Agent, or Firm* — Zilka-Kotab, PC

(57) ABSTRACT

According to one embodiment, a photoconductive semiconductor switch includes a structure of nanopowder of a high band gap material, where the nanopowder is optically transparent, and where the nanopowder has a physical characteristic of formation from a sol-gel process. According to another embodiment, a method includes mixing a sol-gel precursor compound, a hydroxy benzene and an aldehyde in a solvent thereby creating a mixture, causing the mixture to gel thereby forming a wet gel, drying the wet gel to form a nanopowder, and applying a thermal treatment to form a SiC nanopowder.

17 Claims, 2 Drawing Sheets

(56) References Cited

U.S. PATENT DOCUMENTS

| | | | | |
|---|---|---|---|---|
| 2011/0133203 A1* | 6/2011 | Werne | ................ | C04B 35/5755 257/76 |
| 2011/0204399 A1* | 8/2011 | Lim | .................. | H01L 33/0079 257/98 |
| 2012/0104354 A1* | 5/2012 | Tanaka | .................. | H01L 33/42 257/9 |
| 2012/0118375 A1* | 5/2012 | Yoshikawa | .......... | H01G 9/2031 136/257 |
| 2013/0000952 A1* | 1/2013 | Srinivas | .................. | H01B 1/02 174/126.1 |

OTHER PUBLICATIONS

Hidehiko et al. (Hidehiko) "Low temperature sintering and elongated grain growth of 6H—SiC poder with AlB2 and C additives" J. Mater Res., vol. 14, Feb. 1998 p. 518-522.*

Paschotta, Dr. Rudiger, "Encyclopedia of Laser Physics and Technology: Photoconductive Switches," RP Photonics Consulting GmbH, Jul. 10, 2008, http://rp-photonics.com/photoconductive_switches.html, 1 page.

Sullivan et al., "Wide Bandgap Extrinsic Photoconductive Switches," U.S. Department of Energy by the University of California, Lawrence Livermore Laboratory, TPS Paper 1945, Sep. 25, 2007, pp. 1-6.

Sullivan et al., "6H—SiC Photoconductive Switches Triggered at Below Bandgap Wavelengths," Lawrence Livermore National Laboratory, Feb. 22, 2007, pp. 1-6.

"Large Transparent Ceramic Components for Compact High-Power Lasers," 2007 R&D 100 Award Entry, Feb. 1, 2007.

"Cree confirms 4-inch SiC switch under USAF deal," Compound Semiconductor.Net, Sep. 15, 2005, pp. 1-2.

Sampayan et al., "Development of Compact Pulsed Power for the Dielectric Wall Accelerator (DWA)," Lawrence Livermore National Laboratory, pp. 1-4.

Restriction/Election Requirement from U.S. Appl. No. 12/633,671 dated Nov. 7, 2011.

Non-Final Office Action from U.S. Appl. No. 12/633,671 dated Dec. 19, 2011.

Final Office Action from U.S. Appl. No. 12/633,671 dated Apr. 20, 2012.

Examiner's Answer from U.S. Appl. No. 12/633,671 dated Nov. 26, 2012.

Patent Board Decision on Appeal from U.S. Appl. No. 12/633,671, dated Jul. 1, 2015.

Werne et al., U.S. Appl. No. 12/633,671, filed Dec. 8, 2009.

Notice of Allowance from U.S. Appl. No. 12/633,671, dated Dec. 21, 2015.

* cited by examiner

SOL-GEL PROCESS FOR THE MANUFACTURE OF HIGH POWER SWITCHES

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to optically transparent materials, and particularly, to optically transparent photoconductive semiconductor switches and the methods of making the same.

BACKGROUND

Materials generally exhibit a certain band gap related to the material's physical and electronic properties. A band gap is specific to each solid material, and may be defined as an energy range in which there exists no electron state for placement of electrons. The band gap is described herein in terms of the energy difference (in electron volts eV) between the valence band and the conduction band for a material. The lower the band gap, the easier it is to ionize a material, e.g., by removing an electron.

High band gap materials, particularly semiconductors, are useful in photoconductive semiconductor switch (PCSS) applications. How high the band gap must be before the material is considered a "high band gap" material depends on what application the material is being used for. Generally, a high band gap material can be considered any material having an electronic band gap larger than about 1.0 eV. However, in some application, materials with an electronic band gap of larger than about 2.0 eV or more may be considered high band gap materials.

In addition to a high band gap, materials that are useful in PCSS applications have high critical electrical strength, high electron saturation velocity, high thermal conductivity, and low resistance when excited by a laser, or other optical source, with the proper wavelength and power.

Obtaining suitable PCSS materials presents certain challenges. For example, the purchase of PCSS materials is difficult as these materials are very expensive. Moreover, conventional formation techniques of suitable PCSS materials typically involve growing single crystals from seed crystals to a desired size and purity prior to cutting the single crystals into the desired shapes and size for photoconductive switches. This single crystal growing process, however, is extremely slow, costly and requires high formation temperatures, which limits the quantity and type of doping agents that may be dispersed in the molten single crystal growing process. Additionally, the crystal growing process is difficult to control, and frequently leads to crystal boules with significant imperfections, such as "pipes," inclusions, impurities, and/or other defects, which reduce the useful yield of the boule itself and yields a final crystal product with less than desirable performance characteristics, especially in optical applications, such as PCSS applications.

Conventional methods for forming PCSS materials, with laser optical transparency, from nanopowders also present several disadvantages. Such processes typically start with a very pure co-precipitated powder, which is then slip cast in the presence of a gelling agent to form the green structure prior to sintering. A uniform slurry of high purity powder is poured into a plaster mold, which sucks the water out of the slurry by capillary forces and produces the green structure after drying. Using fluid flow and surface tension to consolidate the ceramic powder allows parts to be made with a uniform powder packing. However, because the mold removes the water, slip casting can only be used for relatively thin parts. The need for a very porous surface on the mold also introduces another variable in the green structure fabrication. The porous mold, usually made of commercial gypsum, may also be a source of contamination. Moreover, the presence of the gelling agent, or its by products, in the final structure is an impurity that adversely affects the optical properties of the ceramic. Cold uniaxial pressing and cold isostatic pressing have also been used to make transparent parts. However, inter-particle friction during the pressing process tends to prevent densification in the center of the part so that size of the part must be kept small enough that this does not cause porosity.

Finer nano-sized powder than that produced by precipitation may be used. This can be especially important for achieving high transparency needed for lasers. Finer particles, because of their increased surface area, sinter more easily. However, smaller nano-sized particles behave differently than larger (such as micrometer) sized particles during green structure consolidation. For instance, smaller particles experience more friction as they move past one another in a die making it more difficult to produce a uniform structure through cold pressing, especially where larger parts are desired. The higher surface area of finer particles also requires more water for wetting making it difficult to get the solids loading high for slipcast slurries. As a result, after slip casting there is significant shrinkage on drying, often leading to cracking and other problems. Finer particles are more susceptible to surface-area-dependent chemical reactions, as may occur between a porous mold and certain ceramic powders.

Since it is difficult to find all of the desired properties in a single material which can be used in PCSS application in a cost efficient way, it would be desirable to have methods to make materials that can be used in PCSS applications and/or to have additional materials capable of being used in PCSS applications that can be manufactured and/or produced more inexpensively and precisely than conventionally used materials.

SUMMARY

According to one embodiment, a photoconductive semiconductor switch includes a structure of nanopowder of a high band gap material, where the nanopowder is optically transparent, and where the nanopowder has a physical characteristic of formation from a sol-gel process.

According to another embodiment, a method includes mixing a sol-gel precursor compound, a hydroxy benzene and an aldehyde in a solvent thereby creating a mixture, causing the mixture to gel thereby forming a wet gel, drying the wet gel to form a nanopowder, and applying a thermal treatment to form a SiC nanopowder.

Other aspects and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1:
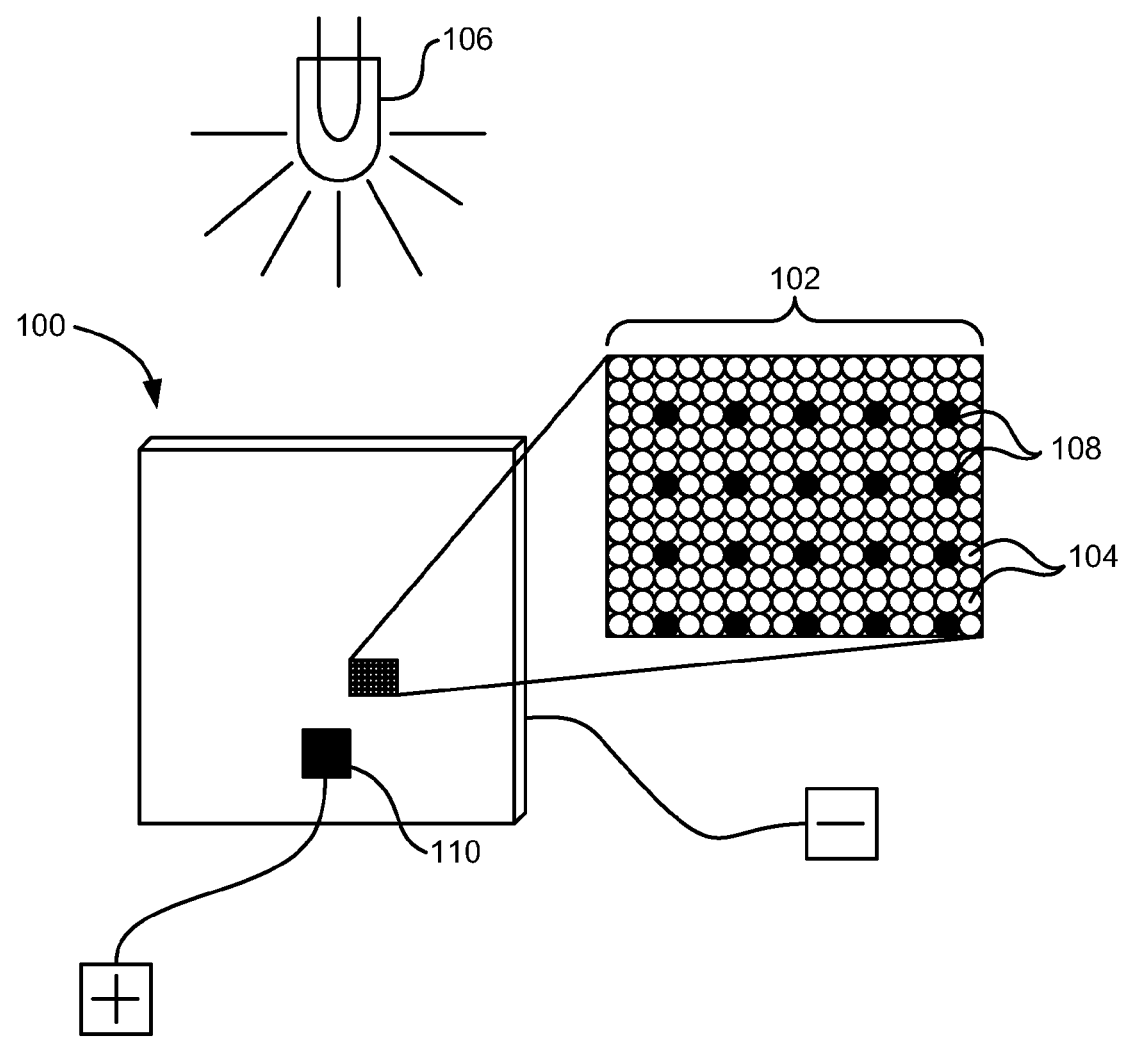
FIG. 1 is a schematic diagram of a structure that may be used in photoconductive semiconductor switch applications, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

As used herein, the term "about" when combined with a value refers to plus and minus 10% of the reference value. For example, a length of about 1000 nm refers to a length of 1000 nm±100 nm, a temperature of about 50° C. refers to a temperature of 50° C.±5° C., etc.

Disclosed herein, according to some embodiments, is a method for fabricating a transparent ceramic structure, e.g. comprising SiC, for use in photoconductive semiconductor switch (PCSS) applications and products made therefrom. The methods disclosed herein include sol-gel chemistry.

According to one general embodiment, a photoconductive semiconductor switch includes a structure of nanopowder of a high band gap material, where the nanopowder is optically transparent, and where the nanopowder has a physical characteristic of formation from a sol-gel process.

According to another general embodiment, a method includes mixing a sol-gel precursor compound, a hydroxy benzene and an aldehyde in a solvent thereby creating a mixture, causing the mixture to gel thereby forming a wet gel, drying the wet gel to form a nanopowder, and applying a thermal treatment to form a SiC nanopowder.

As noted above, conventional methods of forming PCSS materials, e.g. 6H—SiC, 4H—SiC, etc., from single crystal growing processes and/or green structures using nanoparticles/nanopowders are typically lengthy, costly, difficult to control, may require high formation temperatures and are limited with regard to the stoichiometric ratios of the resulting material and the addition of doping agents. Accordingly, embodiments discussed herein describe formation of PCSS materials via a sol-gel process, which may replace the single crystal growing processes as well as conventional high temperature processes involving nanopowders that are limited in application uses. For example, the sol-gel processes described herein may allow for uniform mixing of various compositions, phases, and doping agents of a wide variety and amount. Various embodiments described herein describe sol-gel processing to form a nanopowder silicate in a uniform mix of hydrocarbons that can be reduced in subsequent heat treatments to form SiC nanopowder.

An exemplary sol-gel process involves a synthetic chemical process where reactive monomers are mixed into a solution and polymerization occurs leading to a highly cross-linked three-dimensional solid network resulting in a gel. The composition, pore and primary particles sizes, gel time, surface areas, and density may be tailored and controlled by the solution chemistry. The gels may then be subjected to supercritical extraction or controlled slow evaporation of the liquid phase from the gel. Supercritical extraction of these gels generally allows the surface tension of the leaving liquid phase to be reduced to near zero and results in a highly porous skeletal structure which is low density aerogel. Controlled slow evaporation of the liquid phase from the gels leads to a xerogel, which may be high density. Applying stress during the extraction phase may also result in high density materials.

In various approaches, replacing single crystal PCSS materials with polycrystalline or crystalline material formed via the sol-gel processes described herein may significantly reduce manufacturing costs, increase production output of switches and improve properties of the switches by allowing a wider and larger amount of doping agents to be added to the composition of said switches.

Referring now to FIG. 1, a schematic diagram of a structure 100 that may be used in PCSS applications is shown according to one exemplary embodiment. As an option, the structure 100 may be implemented in conjunction with features from any other embodiment listed herein, such as those described with reference to the other FIGS. Of course, the structure 100 and others presented herein may be used in various applications and/or in permutations, which may or may not be specifically described in the illustrative embodiments listed herein. Further, the structure 100 presented herein may be used in any desired environment.

As shown in FIG. 1, the structure 100 comprises a structure 102 of nanopowder 104 of a high band gap material, where the nanopowder 104 is optically transparent. As used herein, optical transparency refers to the property of transmitting light without an appreciable amount of scattering, e.g. without scattering about plus or minus 10% of the incident light.

Additionally, the nanopowder 104 has a physical characteristic of formation from a sol-gel process. For example, a sol-gel process may produce fine nanopowder and allow for a uniform distribution of various compositions, phases and doping agents disposed in the fine nanopowder.

In one embodiment, the nanopowder 104 may be adapted to exhibit a lower electrical resistance when excited by light 106 relative to an electrical resistance thereof when not exposed to the light 106.

In another embodiment, the nanopowder 104 may comprise silicon carbide (SiC). In some approaches, the stoichiometric ration of Si to C is 1:1. In other approaches, the nanopowder 104 may comprise one or more different phases of SiC. For example, the nanopowder 104 may comprise 6H—SiC, 4H—SiC or mixtures thereof.

In yet another embodiment, the structure 100 may further comprise a dopant 108. The dopant 108 may include, but is not limited to, nitrogen, vanadium, titanium, aluminum, tungsten, phosphorous, oxygen, zinc, etc. or other such suitable dopant as would be recognized by one having skill in the art upon reading the present disclosure. Further, the amount of dopant 108 that the structure 100 includes may be determined by the desired physical and electronic effects that the dopant 108 exhibits in the structure 100. The dopant 108 may also be added to the structure 100 as the structure is being formed, may be included in a previously formed structure which can be ground up and used to form the new structure, may be introduced into the formed structure, or may be added according to any other method as would be known to one of skill in the art.

In further embodiments, the structure 100 may be substantially free of defects. The defects may be selected from a group consisting of pipes, inclusions, and impurities. Note that the term "impurities" refers to any material not desired to be included in the structure. Also, the term "substantially free" is meant to mean greater than 95% free of defects based on a volume of the structure, and more preferably greater than 98% free of defects based on a volume of the structure, ideally greater than 99% free of defects based on a volume of the structure. Pipes are structural defects, which may occur during the production of the green structure and/or ceramic, and are not desired elements.

In additional embodiments, the structure 100 may include electrodes 110 coupled to ends of the structure 100. The electrodes 110 may be of any type known in the art, such as pads, wires, etc. The electrodes 110 may also be coupled to some other system. Additionally, the electrodes may be formed through plasma sputtering (e.g., by physical vapor depositing (PVD) a thin layer of metal onto the surface of the structure, then bonding the electrodes to this metal), chemical vapor deposition (CVD), plasma-enhanced CVD (PECVD), magnetron sputtering, flame spray pyrolysis, laser ablation, etc.

According to one embodiment, the structure 100 may have a volumetric size greater than about 1 mm$^3$.

According to another embodiment, the nanopowder 104 may have a primary particle diameter of less than about 2000 nanometers as present in the final structure. In other approaches, the particles may have a primary particle diameter less than about 500 nm, less than about 100 nm, less than about 10 nm, etc. A primary particle diameter may include a mean particle diameter, a median particle diameter, etc. In some approaches, the nanopowder may preferably have a spherical morphology.

According to yet another embodiment, the structure 100 may be able to hold back an equivalent of at least about 50 kV (e.g., 50±10 kV) per cubic mm of the structure, preferably greater than about 75 kV, and in some approaches greater than about 100 kV.

According to additional embodiments, the structure 100 may have spatially varying properties. For example, the resistance of the structure 100 may change depending on which portion of the structure 100 is being analyzed or used. In another example, the structure 100 may react more to light 106 depending on how close to the exterior surface of the structure 100 the reaction is being tested or used. Also, the dopants 108 present in the structure 100 may be of different volumetric percentages in different portions of the structure 100. Of course, any other spatially varying property may also be exhibited by the structure 100, as would be apparent to one of skill in the art reading the present disclosure.

In yet further embodiments, the nanopowder 104 may have a physical characteristic of being formed, at least in part, by sintering the powder in loose form. For example, a sol-gel process may produce finer nanopowder relative to conventional powder forming processes. Further, loose nanopowder that is fine, because of its increased surface area, may sinter more easily and result in only very small trapped pores. Accordingly, a physical characteristic of being formed, at least in part, by sintering the may include the present of only very small trapped pores, which are less effective in scattering light than larger pores.

Figure 2:
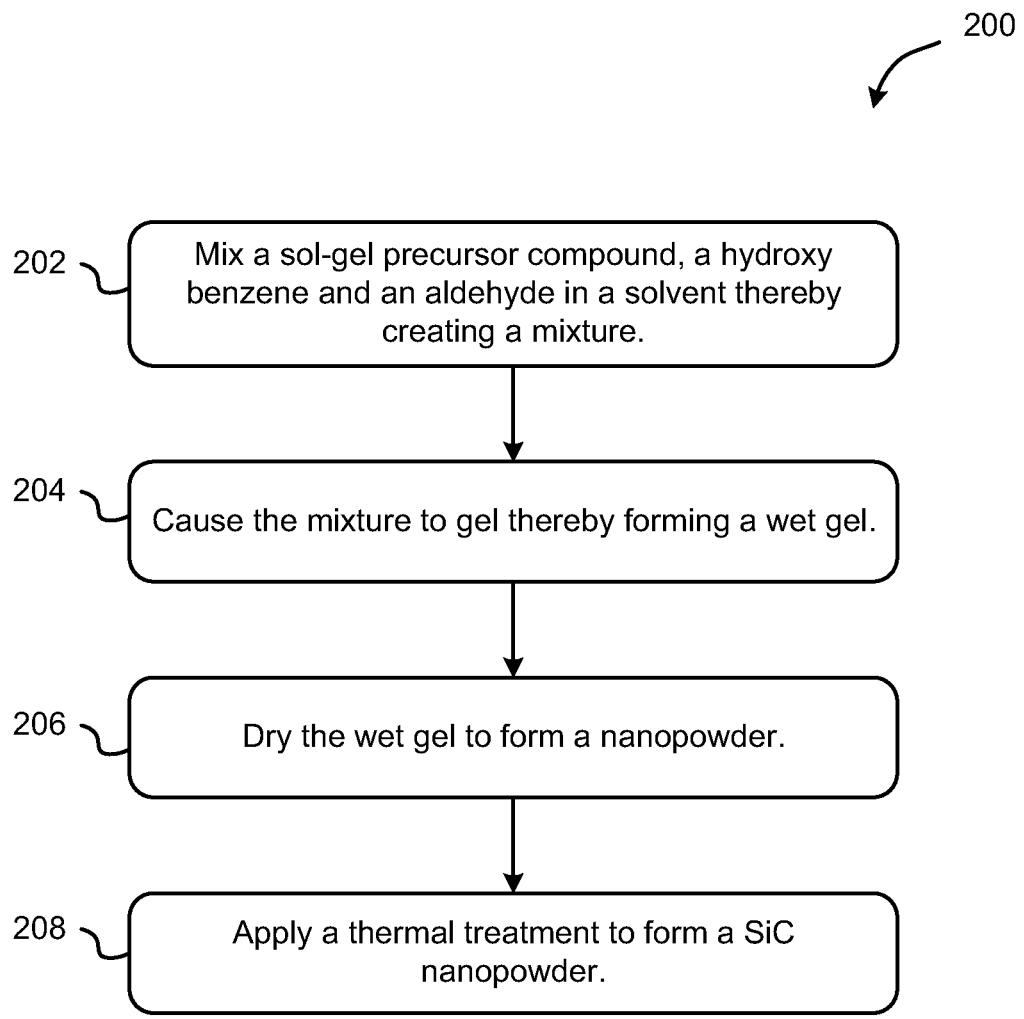
FIG. 2 is a flowchart showing a method for forming optically transparent SiC nanopowder for use in photoconductive semiconductor switch applications, according to one embodiment.

Now referring to FIG. 2, a flowchart of a method 200 is described in accordance with one embodiment. As an option, the present method 200 may be implemented in conjunction with features from any other embodiment listed herein, such as those shown in the other FIGS. Of course, this method 200 and others presented herein may be used in various applications and/or permutations, which may or may not be related to the illustrative embodiments listed herein. Further, the methods presented herein may be carried out in any desired environment. Moreover, more or less operations than those shown in FIG. 2 may be included in method 200, according to various embodiments.

As shown in FIG. 2, a mixture of a sol-gel precursor compound, a hydroxy benzene and an aldehyde are mixed in a solvent. See operation 202. In some approaches, the sol-gel precursor may be compound comprising silicon, such as a silicon alkoxide. For example, the sol-gel precursor may comprise tetramethylorthosilicate (TMOS), tetraethylorthosilicate (TEOS), etc. In other approaches, the sol-gel precursor compound may comprise silicon tetrachloride.

As used herein, a hydroxy benzene compound refers to compounds comprising at least one benzene ring, which benzene ring possesses at least one hydroxyl group (e.g., —OH). Examples of suitable hydroxylated benzene compounds may include, but are not limited to, phenol, catechol, resorcinol, hydroquinone, phloroglucinol, and mixtures thereof. Further, the hydroxy benzene compound may include other substituents at non-hydroxylated ring positions, provided such substituents do not unduly interfere, prevent, alter or slow the polymerization reaction between the compounds added to the mixture.

In some approaches, the aldehyde may include formaldehyde, acetaldehyde, propionaldehyde, butyraldehyde, benzaldehyde, etc. and mixtures thereof. Of course, other suitable aldehydes as would be understood by one having skill in the art upon reading the present disclosure may be used.

In various approaches, the solvent may be water. However, in other approaches, non-aqueous solvents may be used, including but not limited to acetone, amyl acetate, dimethylsulfoxide, hydroxylic solvents such as glycols and short chain alcohols, including methanol, ethanol, propanol and isopropanol, and mixtures thereof.

According to one embodiment, at least one dopant may be added to the mixture. In some approaches, the at least one dopant may be added to the mixture prior to any step causing the mixture to gel (e.g. prior to operation 204 discussed below). In more approaches, the at least one dopant may include, but is not limited to, nitrogen, vanadium, titanium, etc. or other suitable dopant as would be recognized by one having skill in the art upon reading the present disclosure. In various approaches, the addition of the dopant may improve sintering of the resulting SiC nanopowder (discussed below) and/or the properties of the resulting SiC nanopowder.

According to yet another embodiment, at least one catalyst may be added to the mixture. In various approaches, the catalyst may be an acid catalyst, such a nitric acid, trifluoroacetic acid, etc. In other approaches, the catalyst may be a base catalyst, such as ammonium hydroxide, sodium hydroxide, sodium carbonate, etc. or other suitable base known in the art.

With continued reference to FIG. 2, the method 200 also includes causing the mixture to gel thereby forming a wet gel. In one embodiment, causing the mixture to gel comprises adjusting a pH of the mixture. In various embodiments, the pH of the mixture may be determined by the concentration of an added catalyst, such as those described herein. For example, a base catalyst, e.g. ammonium hydroxide, may be slowly added to the mixture to raise the pH in a homogeneous manner to facilitate the formation of a gel and not a precipitate. In some embodiments, the preferred pH of the mixture necessary to facilitate the mixture to gel may vary depending on the composition of the mixture (e.g. the identities and quantities of at least one of the sol-gel precursor compound, the hydroxy benzene compound, the aldehyde, etc.).

In another embodiment, causing the mixture to gel may include heating the mixture at a gelation temperature for a gelation time. In some approaches, the gelation temperature may be in a range from about 20° C. to about 100° C., preferably from about 30° C. to about 50° C. In more approaches, the gelation time may be in a range from about 1 hour to about 36 hours. In various approaches the gelation temperature and gelation times may vary according to the compositions and/or density of the reaction mixture. In various approaches, the composition, phase, and other such properties of the resulting wet gel may vary and/or be determined by the gelation temperature, the gelation temperature, the composition and/or quantity of the reaction mixture, etc.

In yet another embodiment, the wet gel may be further treated to promote the gelation process (e.g. to promote cross-linking) and/or to further stabilize and/or purify the chemical structure thereof. For example, in some approaches, the wet gel may be washed to remove any impurities, such as dissolved nitrates, excess catalyst, etc.

As also shown in FIG. 2, the wet gel is then dried to form a nanopowder. See operation 206. In one embodiment, drying the wet gel may involve a supercritical drying (extraction) technique. Supercritical drying may involve, in some approaches, placing the wet gel in an autoclave where the temperature and pressure are increased above the supercritical point of the fluid present in the pores of the wet gel.

In another embodiment, drying the wet gel may involve a freeze drying technique, where liquid present in the pores of the wet gel is cooled to a solid and sublimed. In yet another embodiment, drying the wet gel may involve a spray-drying technique. In further embodiments, drying the wet gel to form a nanopowder may involve a combination of suitable drying techniques, such as those disclosed herein.

Referring again to FIG. 2, a first thermal treatment may be applied to the nanopowder to form a SiC nanopowder. See operation 208. In some embodiments, the first thermal treatment may involve heating the nanopowder at a temperature of less than about 1100° C. for in an atmosphere comprising at least hydrogen. In some approaches, the atmosphere involved in the first heat treatment may comprise 4% hydrogen ($H_2$) in argon. In other approaches, the atmosphere may comprise 4% hydrogen in helium. In more approaches, the atmosphere may be comprise between about 1% to about 99.9% hydrogen relative to a suitable inert gas (e.g. argon, helium, etc.). Additionally, the first heat treatment may be applied to the nanopowder for a specified time, e.g. about 1 hour, about 2 hours, about 4 hours, about 8 hours, etc. In one illustrative approach, the first thermal treatment may involve heating the nanopowder at a temperature of less than about 1100° C. for 2 hours in an atmosphere comprising 4% hydrogen ($H_2$) in argon.

In approaches where the nanopowder is heated at a temperature equal to or less than about 1100° C. in an atmosphere comprising at least hydrogen, the resulting SiC nanopowder may be amorphous yet still fine.

In another embodiment, the method 200 may include application of a second thermal treatment, whereby the nanopowder is heated at a temperature between about 1100° C. to about 1700° C. in an atmosphere comprising at least hydrogen to form a SiC nanopowder. In some approaches, heating the nanopowder at a temperature between about 1350° C. and 1650° C. in an atmosphere comprising at least hydrogen (e.g. 1%-99.9% hydrogen in argon, helium or other suitable inert gas) may result in a crystalline SiC nanopowder. In additional approaches, the second thermal treatment may also include application of a pressure, e.g. about 5000 psi to about 50,000 psi, to the nanopowder. Further, the second thermal treatment may involve heating the nanopowder at a temperature between about 1100° C. to about 1700° C. and/or applying pressure to the nanopowder a given amount of time, e.g. 30 seconds, 1 minute, 5 minute, 1 hour, etc.

In some approaches, the method 200 may include application of only the first thermal treatment, only the second thermal treatment, may include application of additional thermal treatments involving different temperature, time and atmospheric conditions, or any combination thereof. According to one illustrative embodiment, the method 200 may involve at least the first and second thermal treatments. For example application of the first heat treatment (e.g. heating at a temperature of less than about 1100° C. in an atmosphere comprising at least hydrogen) to the nanopowder may form an amorphous SiC nanopowder. Next, the second thermal treatment (e.g. heating at a temperature in a range of about 1100° C. to about 1700° C. in an atmosphere comprising at least hydrogen) may be applied to the amorphous SiC nanopowder, thereby converting the amorphous SiC nanopowder to a crystalline SiC nanopowder and/or increasing the size of the individual particles disposed in the SiC nanopowder.

In yet another embodiment, the method 200 may involve heating the SiC nanopowder in air at a temperature less than about 450° C. to remove excess carbon.

According to some embodiments, the phase, composition and/or particle size of the SiC nanopowder may vary according to the composition of the reaction mixture, sol-gel processing parameters, parameters of the drying process utilized to dry the sol-gel solution, and the heat treatment conditions (e.g. temperature, time at a given temperature, furnace environment/atmosphere, etc.).

In further embodiments, the method 200 may additionally include sintering the SiC nanopowder in loose form. In some approaches, the SiC nanopowder in loose form may be sintered under pressuring using known techniques including, but not limited to, hot pressing, spark plasma sintering, etc. For example, the SiC nanopowder, in on embodiment, may be compacted in a die and hot pressed at a temperature less than about 1650° C. in a protective environment (argon, hydrogen, nitrogen, and/or helium) to achieve higher, desired or substantially full densities. For instance, a higher range of SiC density values may include about 1 to about 2 $g/cm^3$ and may approach about 3.2 $g/cm^3$. However, in some instances lower density values may be desired for a specific application.

In other approaches, the method 200 may further comprise hot is statically pressing the sintered SiC nanopowder.

According to some exemplary embodiments, additional thermal treatments may be applied to the SiC nanopowder to adjust the particle size and/or composition of the SiC nanopowder prior to or subsequent to any sintering and hot isostatic pressing steps. For instance, in some approaches, after sintering the SiC nanopowder, an additional thermal treatment utilizing lower temperatures and longer time periods (relative to previous thermal treatments and/or the sintering conditions) may alter the structure and/or properties of the crystalline phase of the SiC nanopowder, e.g. by making the crystalline phase more homogenous, but not substantially alter the particle size of the SiC nanopowder. Such control over the structure and/or properties of the crystalline phase of the resulting SiC nanopowder may affect its optically transparent properties. Accordingly, SiC photoconductive semiconductor switches formed utilizing the methods described herein may be tailored to switch at a desired wavelength.

According to more approaches, the method 200 may further comprise forming electrodes on at least a portion of the sintered structure, such as a piece of the structure cut to a specific size.

According to yet more approaches, high power photoconductive switches may be extremely useful to high power electronics industries in both defense and commercial applications. For commercial purposes, affordable photo-optical switches may be highly desired for the development of a compact proton accelerator for radiotherapy treatment of cancer. Also, as far as defense applications go, directed energy weapons may use these switches to create and direct the energy used in these weapons.

Example

An exemplary method for producing 6H—SiC via the sol-gel processes described herein is provided below. It is important to note this example is provided by way of example only and is not limiting in any way.

Resorcinol is dissolved in water while stirring in a glass vessel. To this solution, add formaldehyde and tetramethylorthosilicate (TMOS). While stirring this mixture, slowly add ammonium hydroxide ($NH_4OH$) drop-wise. The solution may become opaque within an hour.

The solution is then placed in an oven for about 24 hours at about 50° C. to complete the reaction and form a gel of the proper mixture. The resulting wet gel is optionally washed to remove dissolved nitrates. The wet gel is then dried to a fine powder by freeze dry or spray dry techniques. The fine powder is then reacted at 1100° C. for 2 hours in 4% $H_2$/argon atmosphere to fine SiC powder. Any excess free-carbon may be removed by heat treating in air at 450 C.

The SiC nanopowder is then heat treated at 1450° C. in 4% $H_2$-argon to increase the particle size and convert from amorphous to crystalline form as needed for the subsequent consolidation steps. The powder is the be compacted in a die and hot pressed at <1650° C. in a protective environment (argon, hydrogen, nitrogen, or helium) to achieve full density. A subsequent hot isostatic pressing step may also be implemented to reach full density.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   mixing at least a sol-gel precursor compound, and a hydroxy benzene in a solvent thereby creating a mixture;
   causing the mixture to gel thereby forming a wet gel;
   drying the wet gel to form a nanopowder; and
   applying a first thermal treatment to the nanopowder to form a SiC nanopowder,
   wherein drying the wet gel comprises at least one of freeze drying, spray drying and supercritical drying.

2. The method of claim 1, further comprising adding at least one catalyst to the mixture prior to causing the mixture to gel.

3. The method of claim 2, wherein the catalyst is selected from the group consisting of: ammonium hydroxide and sodium carbonate.

4. The method of claim 1, wherein causing the mixture to gel comprises adjusting a pH of the mixture and/or heating the mixture at a gelation temperature for a gelation time.

5. The method of claim 1, wherein the hydroxy benzene is selected from a group consisting of: resorcinol, catechol, hydroquinone, phloroglucinol and mixtures thereof.

6. A method, comprising:
   mixing at least a sol-gel precursor compound, and a hydroxy benzene in a solvent thereby creating a mixture;
   causing the mixture to gel thereby forming a wet gel;
   drying the wet gel to form a nanopowder; and
   applying a first thermal treatment to the nanopowder to form a SiC nanopowder,
   wherein the first thermal treatment includes heating the nanopowder at a temperature less than or equal to about 1100° C. in an atmosphere comprising hydrogen and at least one of argon and helium to form the SiC nanopowder.

7. The method of claim 6, further comprising applying a second thermal treatment to the SiC nanopowder, wherein the second thermal treatment includes heating the SiC nanopowder at a temperature ranging from about 1350° C. to about 1700° C. in an atmosphere comprising hydrogen and at least one of argon and helium.

8. The method of claim 6, wherein the first thermal treatment includes heating the nanopowder at a temperature equal to or less than about 1100° C. in an atmosphere comprising 4% hydrogen in argon for about 2 hours.

9. The method of claim 7, wherein the second thermal treatment includes heating the SiC nanopowder at a temperature ranging from about 1350° C. to about 1650° C. in an atmosphere comprising 4% hydrogen in argon.

10. A method, comprising;
    mixing a silicon-containing sol-gel precursor compound, a hydroxy benzene and an aldehyde in a solvent thereby creating a mixture, wherein the silicon sol-gel precursor compound comprises silicon tetrachloride, wherein the hydroxy benzene is selected from the group consisting of: resorcinol, catechol, hydroquinone, phloroglucinol and mixtures thereof;
    causing the mixture to gel thereby forming a wet gel;
    drying the wet gel to form a nanopowder; and
    applying a first thermal treatment to the nanopowder to form a SiC nanopowder, wherein the first thermal treatment includes heating the nanopowder at a temperature less than or equal to about 1100° C. in an atmosphere comprising hydrogen and at least one of argon and helium to form the SiC nanopowder;
    applying a second thermal treatment to the SiC nanopowder, wherein the second thermal treatment includes heating the SiC nanopowder at a temperature ranging from about 1350° C. to about 1650° C. in an atmosphere comprising hydrogen and at least one of argon and helium, and applying pressure ranging from about 5,000 psi to 50,000 psi to the SiC nanopowder; and
    applying a third thermal treatment to the SiC nanopowder, the third thermal treatment including heating the SiC nanopowder in air at a temperature less than about 450° C. to remove excess carbon, wherein the SiC nanopowder has a density in a range from about 1 g/cm$^3$ to about 3.2 g/cm$^3$.

11. The method of claim 10, further comprising adding a dopant to the mixture prior to causing the mixture to gel, wherein the dopant comprises at least one of phosphorous, tungsten, aluminum, zinc, and titanium.

12. The method of claim 11, further comprising adding a catalyst to the mixture prior to causing the mixture to gel, the catalyst including sodium carbonate.

13. The method of claim 12, further comprising washing the wet gel to remove dissolved nitrates prior to drying the wet gel.

14. The method of claim 10, wherein the SiC nanopowder includes a combination of 6H—SiC, and 4H—SiC.

15. The method of claim 10, further comprising sintering the SiC nanopowder, wherein the sintering includes at least one of spark plasma sintering and hot isostatically pressing the SiC nanopowder in loose form.

16. The method of claim 10, wherein drying the wet gel comprises at least one of freeze drying, spray drying and supercritical drying.

17. The method of claim 10, wherein the hydroxy benzene is resorcinol.

\* \* \* \* \*